US012748904B2

(12) United States Patent
Twigg

(10) Patent No.: US 12,748,904 B2
(45) Date of Patent: Sep. 29, 2026

(54) SYSTEM-LEVEL DESIGN TOOL FOR SELECTING AND CONFIRMING COMPATIBILITY OF ELECTRICAL COMPONENTS

(71) Applicant: Microchip Technology Incorporated, Chandler, AZ (US)

(72) Inventor: Christopher Twigg, Endwell, NY (US)

(73) Assignee: Microchip Technology Incorporated, Chandler, AZ (US)

( * ) Notice: Subject to any disclaimer, the term of this patent is extended or adjusted under 35 U.S.C. 154(b) by 814 days.

(21) Appl. No.: 18/068,560

(22) Filed: Dec. 20, 2022

(65) Prior Publication Data

US 2023/0325567 A1 Oct. 12, 2023

Related U.S. Application Data

(60) Provisional application No. 63/329,117, filed on Apr. 8, 2022.

(51) Int. Cl.
*G06F 30/3323* (2020.01)

(52) U.S. Cl.
CPC ................................ *G06F 30/3323* (2020.01)

(58) Field of Classification Search
CPC ................................................... G06F 30/3323
USPC .......................................................... 716/106
See application file for complete search history.

(56) References Cited

U.S. PATENT DOCUMENTS

| | | | | |
|---|---|---|---|---|
| 8,065,653 | B1 | 11/2011 | Best et al. | 716/139 |
| 8,769,477 | B1 | 7/2014 | Gathoo et al. | 716/139 |
| 9,026,962 | B2 * | 5/2015 | Kruberg | G06F 30/392 716/101 |
| 2003/0009730 | A1 | 1/2003 | Chen et al. | 716/102 |
| 2003/0229482 | A1 | 12/2003 | Cook et al. | 703/14 |
| 2005/0080502 | A1 * | 4/2005 | Chernyak | G06F 30/00 716/112 |
| 2005/0193353 | A1 | 9/2005 | Malekkhosravi et al. | 716/117 |
| 2008/0222589 | A1 | 9/2008 | Banerjee | 716/119 |
| 2009/0172621 | A1 | 7/2009 | Sathe et al. | 716/113 |
| 2012/0017198 | A1 | 1/2012 | Ng et al. | 717/106 |
| 2013/0326457 | A1 | 12/2013 | Macmunn et al. | 716/122 |

(Continued)

FOREIGN PATENT DOCUMENTS

WO 2021/101669 A1 5/2021 ............. G06F 30/20

OTHER PUBLICATIONS

Microchip Technology Inc., "MPLAB X IDE User's Guide," URL: https://ww1.microchip.com/downloads/en/devicedoc/50002027d.pdf, 330 pages, Sep. 14, 2015.

(Continued)

*Primary Examiner* — Suresh Memula
(74) *Attorney, Agent, or Firm* — SLAYDEN GRUBERT BEARD PLLC

(57) ABSTRACT

A system-level design generator tool enables users to configure system-level designs made up of electrical components that satisfy design parameters and have corresponding dependencies, e.g., power, communication, control, security, clock and memory. A block diagram representing each of the functions within the system may utilize a guided parametric search or a design tool to create the solution for each individual block. The inputs into that search and/or design tool may come from the system-level choices, constraints, and cross dependencies tracked by the system generator tool.

20 Claims, 15 Drawing Sheets

(56) References Cited

U.S. PATENT DOCUMENTS

| | | | | |
|---|---|---|---|---|
| 2015/0128102 | A1* | 5/2015 | Perry | G06F 30/392 716/137 |
| 2020/0042664 | A1 | 2/2020 | Lee et al. | |
| 2021/0081588 | A1 | 3/2021 | Osburn et al. | |
| 2023/0124676 | A1* | 4/2023 | Sreenivasan | H01L 25/50 716/110 |

OTHER PUBLICATIONS

International Search Report and Written Opinion, Application No. PCT/US2023/016197, 18 pages, Jun. 27, 2023.

* cited by examiner

SYSTEM-LEVEL DESIGN TOOL FOR SELECTING AND CONFIRMING COMPATIBILITY OF ELECTRICAL COMPONENTS

RELATED APPLICATION

This application claims priority to commonly owned U.S. Patent Application No. 63/329,117 filed Apr. 8, 2022, the entire contents of which are hereby incorporated by reference for all purposes.

TECHNICAL FIELD

The present disclosure relates to systems and methods for selecting electrical components and designing functional blocks that form a total system-level solution with cross-functional-block dependency tracking and constraint management.

BACKGROUND

Semiconductor, microchip, and microprocessor suppliers and manufacturers have software tools that enable users to select individual components having specific performance characteristics and design parameters. Component identification tools are available that provide information about components (e.g., schematics, data sheets, or software, without limitation) given specific design parameters. However, customers need further tools to identify components for complete system solutions formed with the components for particular applications. Further, a customer's specific design parameters rarely match 100% with template designs for complete system architectures or complete system solutions.

Many engineers lack the experience or expertise to design all of the various functions that are involved in a system solution. To aid this, many semiconductor vendors provide reference designs that can be dropped into their customer's application or design tools that guide them on designing a specific block. Reference designs are a good starting point, but they nearly always require some amount of modification for the customer's specific needs. Reference designs are the classic approach to providing customers with a "known good" system solution. The issue is that these are static and not easily modified without manual checking of cross-block dependencies. An example is adding additional functional blocks to an existing reference design that cause a particular supply rail to be overloaded.

Design tools are also often provided to help the customer design a specific block. However, the block is tackled by the design tools independently of the rest of the blocks in the system architecture or complete system solution. The user must know what all of the inherited constraints are in the system and track the dependencies across blocks. This can lead to bad component/circuit choices when integrated into a full system, leading to iterative cycles of physical board debugging and redesign.

There is a need for a selection and diagnostic tool to configure system-level electrical designs made up of electrical components that satisfy design parameters and have corresponding dependencies.

SUMMARY

A system-level design generator tool enables users to configure system-level designs made up of components that satisfy design parameters and have corresponding dependencies. At the top level, this may be a block diagram representing each of the functions within the system. Each block may utilize a guided parametric search or a design tool to create the solution for that individual block. The inputs into the guided parametric search and/or design tool may come from the system-level choices, constraints, and cross-block dependencies tracked by the system generator tool. This process may start from a template diagram or a blank diagram. A template diagram contains components in a particular configuration and provides a starting point from which modifications to the diagram may be made. A blank diagram contains no components and provides a clean starting point into which components may be added and modified. When a new component block is added to a system configuration, a system generator tool that tracks cross-block dependencies may recognize the additional load placed upon the specific supply rail and flag it as needing attention. The user may then visit the design tool for component block to pick a new solution for that rail that is more appropriate for the current requirements.

According to one aspect, there is provided an apparatus to configure system-level designs made up of electrical components that satisfy design parameters and have corresponding dependencies, comprising a non-transitory, machine-readable medium including instructions wherein the instructions, when loaded and executed by a processor, configure the processor to: present a system diagram of an electronic system having component blocks representing electrical components; receive constraints or parameters for each electrical component represented by the component blocks; present a list of candidate components corresponding to the constraints or parameters for each electrical component represented by the component blocks; receive an instruction to select a component from the list candidate components for each electrical component represented by the component blocks; and check system dependencies to confirm compatibility of all electrical components selected for inclusion in the system diagram.

Another aspect provides a machine-implemented method to configure system-level designs made up of electrical components that satisfy design parameters and have corresponding dependencies, comprising: presenting a system diagram having component blocks; receiving constraint or parameters for the components of the component blocks; presenting a list of components corresponding to the constraints or parameters; receiving an instruction to select a components from the list; and checking system dependencies to confirm compatibility of all components in the system diagram.

According to another aspect, there is provided a system having: a presentation circuit that presents a system diagram of an electronic system having component blocks representing electrical components; a constraint or parameter input circuit that receives constraint or parameter inputs for each electrical component represented by the component blocks; a component circuit that presents a list of candidate components corresponding to the constraints or parameters for each electrical component represented by the component blocks; a component selection circuit that receives an instruction to select a component from the list candidate components for each electrical component represented by the component blocks; and a system dependency circuit that checks system dependencies to confirm compatibility of all electrical components selected for inclusion in the system diagram.

DESCRIPTION OF THE DRAWINGS

The figures illustrate example methods and systems for a system-level design generator tool that enables users to configure system-level designs made up of components that satisfy design parameters and have corresponding dependencies.

Figure 1:
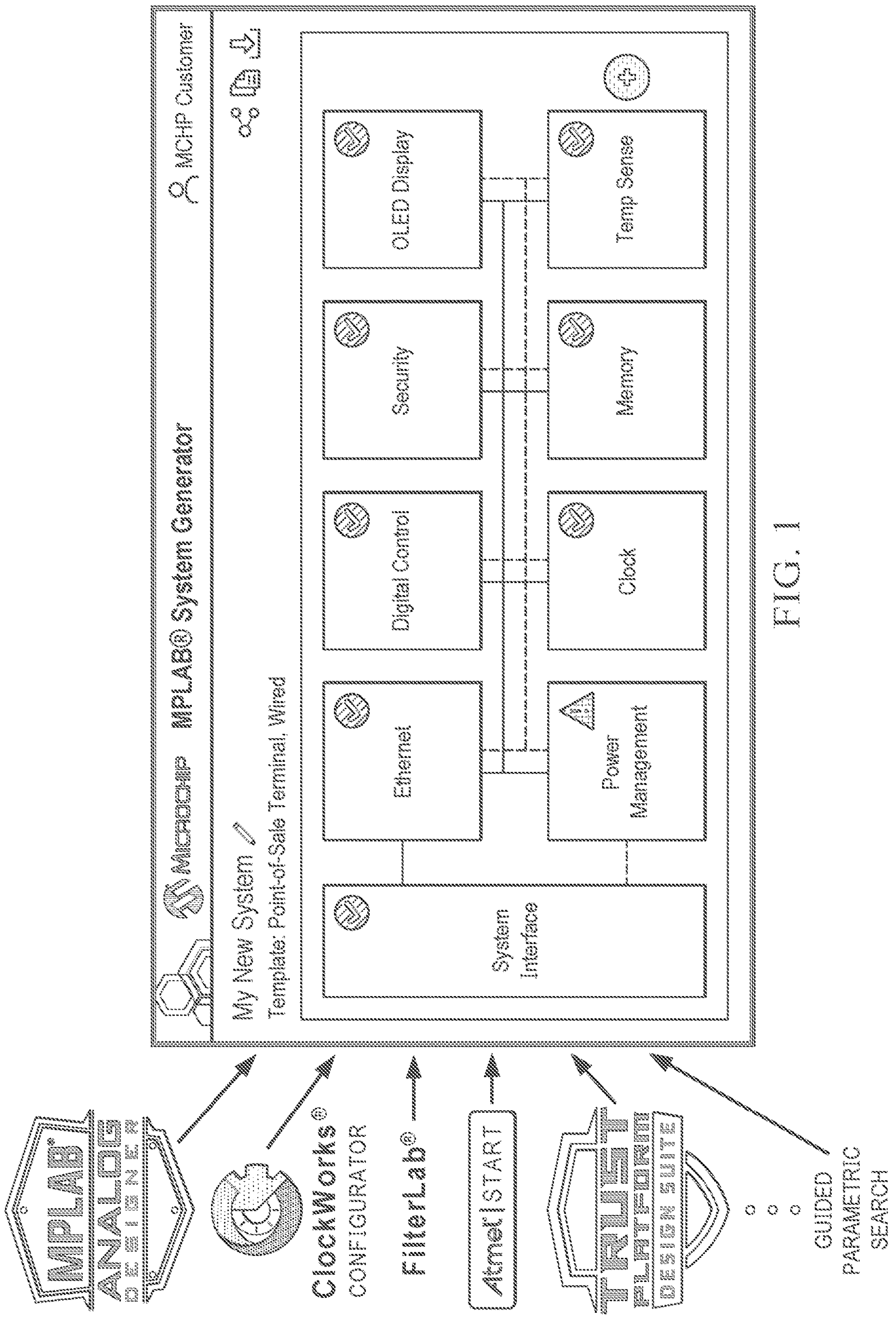
FIG. 1 illustrates an example system-level design generator tool based on tools for selecting individual components of the system.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

According to examples provided, a system generator tool may guide engineers in choosing system elements and checking cross-block dependencies and cross-function dependencies, provide a working solution for engineers, for example, add a power supply for non-power engineers, and provide an initial starting point for engineers. The system generator tool may be a software tool that helps customers select parts represented by component blocks and design functional capabilities that work together to form a system solution. The tool may check cross-block and cross-function dependencies and make component recommendations. An engineer may start from a template diagram (reference design) and customize the template diagram to add/remove component blocks, and change functional capabilities of component blocks, such as power, bandwidth, and noise. While power, bandwidth, and noise are illustrated, any parameter or functional capability of component blocks may be checked. Alternatively, an engineer may start from a blank diagram.

The system generator tool may help mass market customers select the right semiconductor parts, components, or products for their specific electronics application and design the parts, components, or products into a total system solution. A feature of the system generator tool is its ability to track system level constraints and dependencies, which provides a solution for the customer's needs, not a static reference design or merely a bucket of parts, components, or products that may or may not work together. The system generator tool helps reduce the chance of gross errors in a new system design. It also helps speed up such designs or modifications of reference designs allowing customers to get their designs to market in fewer iterations of the hardware.

The system generator tool may provide product selection and design guidance for total system solutions to mass market customers. The system generator tool may guide engineers in choosing system elements and checking dependencies. The system generator tool may provide a working solution for engineers, for example, by recommending a power supply for non-power engineers. The system generator tool may provide an initial starting point for engineers, for example by allowing them to work from a template and then customize as needed. The system generator tool may minimize system-level inconsistencies that lead to early prototype failure. The system generator tool may track cross-block and cross-function dependencies so that dependencies are tracked and applied across all the component functional blocks of the entire system.

The system generator tool may be a web-based interface so that users may access the tool via the internet from any remote terminal. The system generator tool may be provided via a website, but it could also be built in a stand-alone, downloadable form. The system generator tool may be an application (App) installed on a computer work station or a device or a web based application accessed from the internet via a computer work station or device. A value of the online version of the system generator tool application may be that it always reflects the most recent updates in design tools, part selection, or inherited dependencies/constraints.

FIG. 1 is an example system generator tool illustrating building blocks including: system interface, Ethernet, digital control, security, power management, clock, and memory. Individual systems for identifying microchips and other components for individual component blocks may be incorporated into the system generator tool. For example, such individual systems may include: MPLAB Analog Designer, available from Microchip Technology, Inc., of Chandler Arizona, ClockWorks Configurator available from Microchip Technology, Inc., of Chandler Arizona, FilterLab, and Guided Parametric Search, which are example software programs capable of identifying and configuring electronic parts, components, or products. The system generator tool may control the individual systems to build or design total systems comprising microchips and other components. The system generator tool may incorporate already available software for selecting individual components into a software tool that provides a total system solution.

Figure 2:
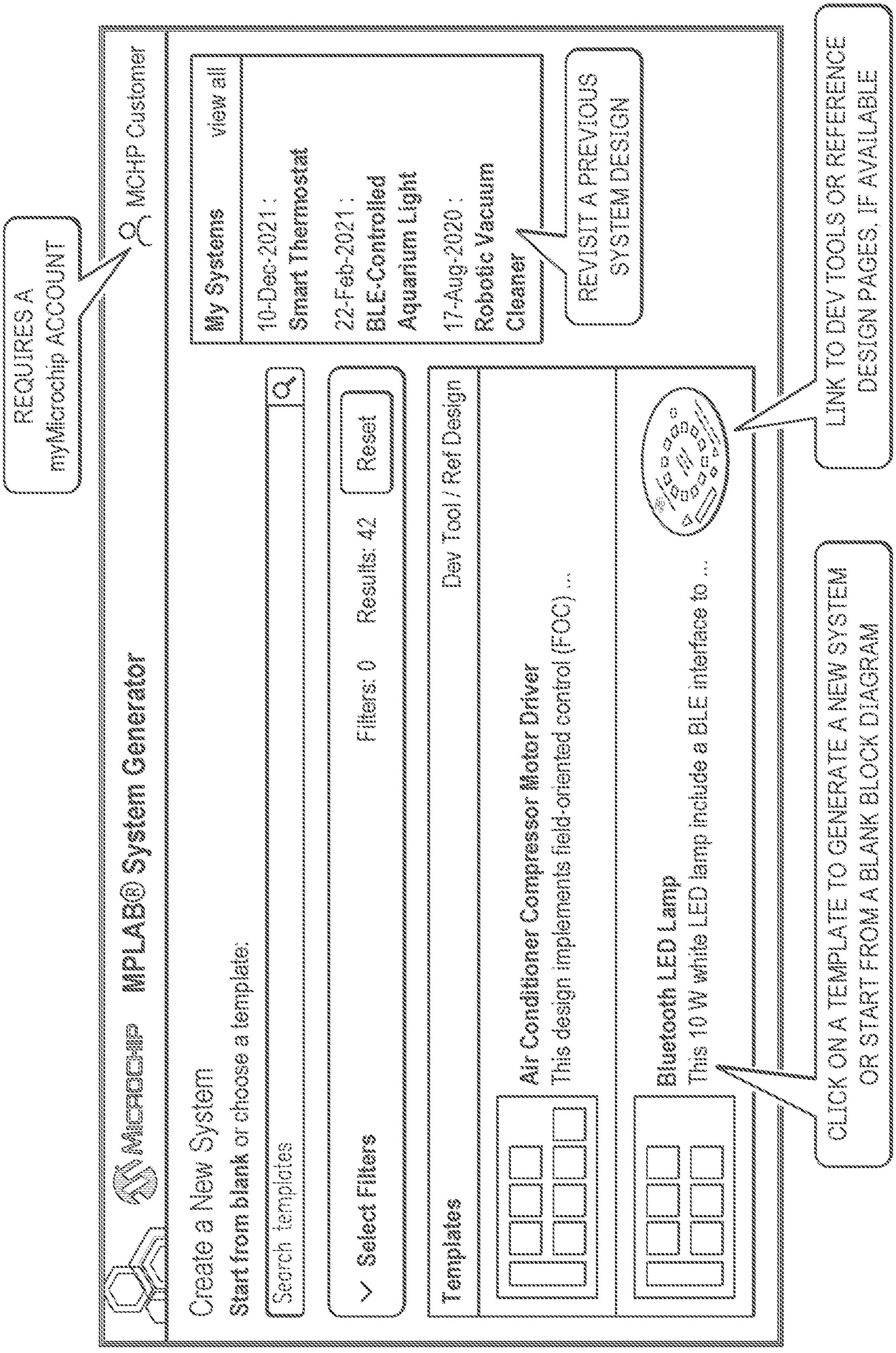
FIG. 2 illustrates, relative to a system generator tool for creating a new electrical control system, an example screen shot of a search screen for finding a template related to a user's application.

FIG. 2 illustrates an example screen shot of a system generator tool for creating a new electrical control system. A customer may use a customer account to log into the web-based interface of the system. A historical listing of systems or projects by the user may be listed under a My Systems catalog. An icon link to development tools or reference design pages may be provided. A list of templates may be provided wherein the name of each template of the list of templates is a respective hyperlink to launch a template upon which the user may click to generate a new system. Alternatively, the user may start from a blank diagram, rather than a template. Templates may include system level templates such as: smart thermostats, BLE-controlled aquarium light, robotic vacuum cleaner, air conditioner compressor motor driver, and Bluetooth LED lamp.

Figure 3:
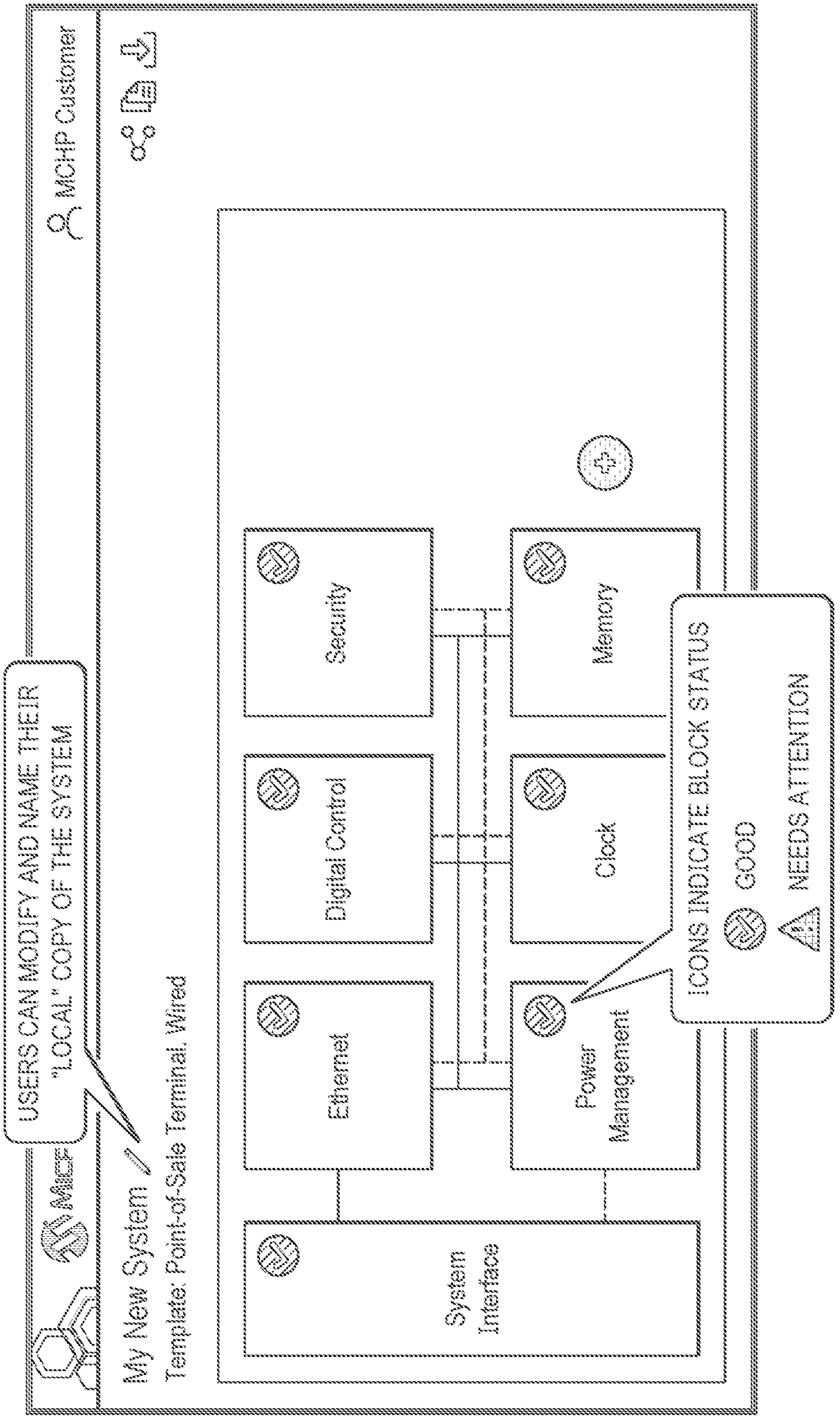
FIG. 3 illustrates a screen shot of an example template.
Figure 4:
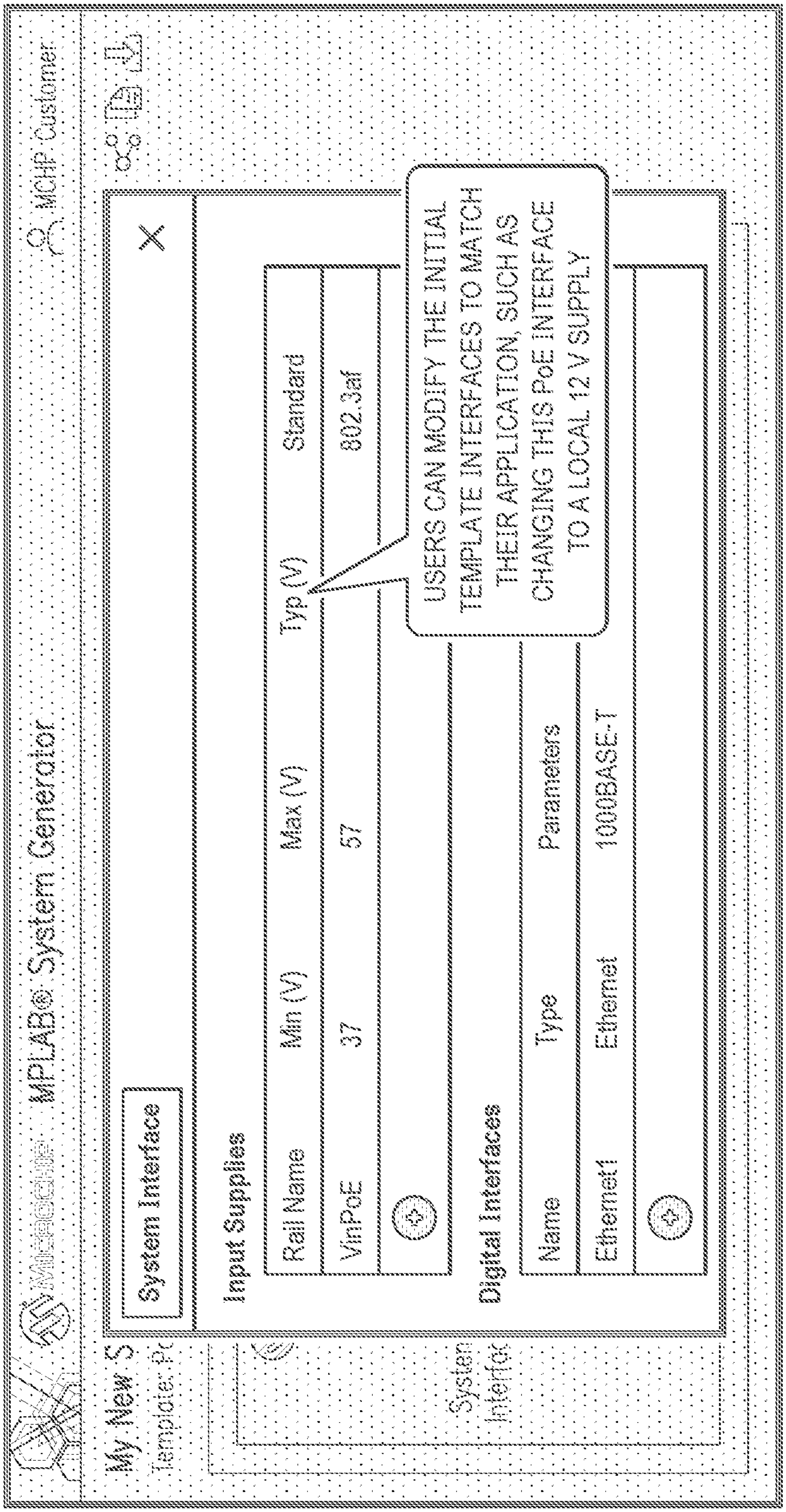
FIG. 4 illustrates an example window to modify the System Interface block.

FIG. 3 illustrates an example screen shot of a template, wherein in this case, it is a template for a wired point-of-sale terminal. Users can modify the name of a "local" copy of the system from the original template. This template provides for system components represented by blocks including: system interface, Ethernet, digital control, security, power management, clock, and memory. Each system component is represented by a component block and interface connections are drawn between the component blocks. A grey circle with a plus sign illustrates an icon for adding more component blocks to the system. Icons may indicate the status of each block, wherein a green circle with a check mark may indicate the status is GOOD and a yellow triangle with an exclamation point may indicate the status of the component block is NEEDS ATTENTION. If the status is NEEDS ATTENTION, the components identified or the selected parameters of an identified component may not be correct to satisfy cross-block and cross-function dependencies. Parameters may include power, bandwidth, and noise. FIG. 4 illustrates an example of a window to modify the System Interface block. The System Interface block itself is a hyperlink icon (see FIG. 3) that allows a user to navigate to the System Interface configuration screen shown in FIG. 4. The System Interface may have input supplies and digital interface characteristics. For the input supplies, a rail name of VinPoE is listed having 37 volt minimum, 57 volt maximum, and the standard is 802.3af. For the digital interfaces, an Ethernet 1 is listed, which is a type of Ethernet having parameters of 1000BASE-T. Users may modify the initial system interface template to match their application, such as changing the input supplies from VinPoE to a local 12 V supply.

Figure 5:
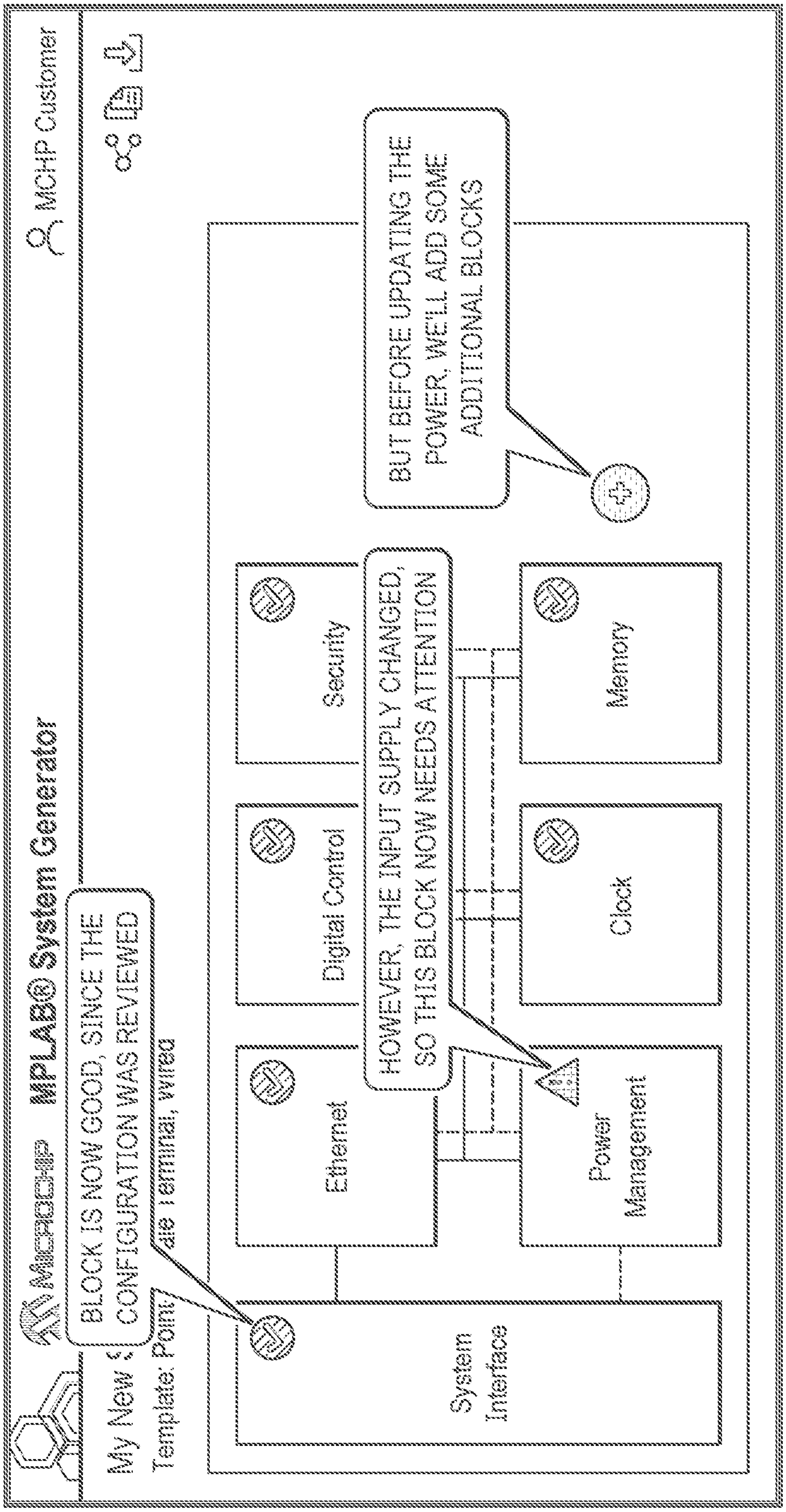
FIG. 5 illustrates an example of the component block template of FIG. 3, which illustrates how the system generator tool performs dependency checks between the component blocks after a component block has been modified via a configuration screen as shown in FIG. 4.

FIG. 5 illustrate and example of the component block template of FIG. 3, which illustrates how the system generator tool performs dependency checks between the component blocks after a component block has been modified via a configuration screen as shown in FIG. 4. Each of the blocks having a green circle with a check mark indicates the status of all dependencies between the components is GOOD. Note that in FIG. 3, the System Interface block has a yellow triangle with an exclamation point, which indicates the status of the block is NEEDS ATTENTION. After the System Interface has been changed via the configuration screen shown in FIG. 4, the status of the System Interface block has changed to a green circle with a check mark indicating the status of all dependencies of the System Interface are GOOD, as shown in FIG. 5. However, because the System Interface block was reconfigured (FIG. 4), the Power Management block status is now indicated as NEEDS ATTENTION, as shown in FIG. 5. This may indicate the power management parameters are not correct to supply a proper level of power, i.e., the power dependency between the component blocks is not compatible or a better solution may be available as a result of the change of the system input voltage. Typically, incompatible dependencies exist between more than two component blocks. Before selecting a new component for power management, a determination may be made as to whether, or not, all component blocks have been added. If not, additional component blocks may be added before updating the power management block. A grey circle with a plus sign illustrates an icon for adding more component blocks to the system.

Figure 6:
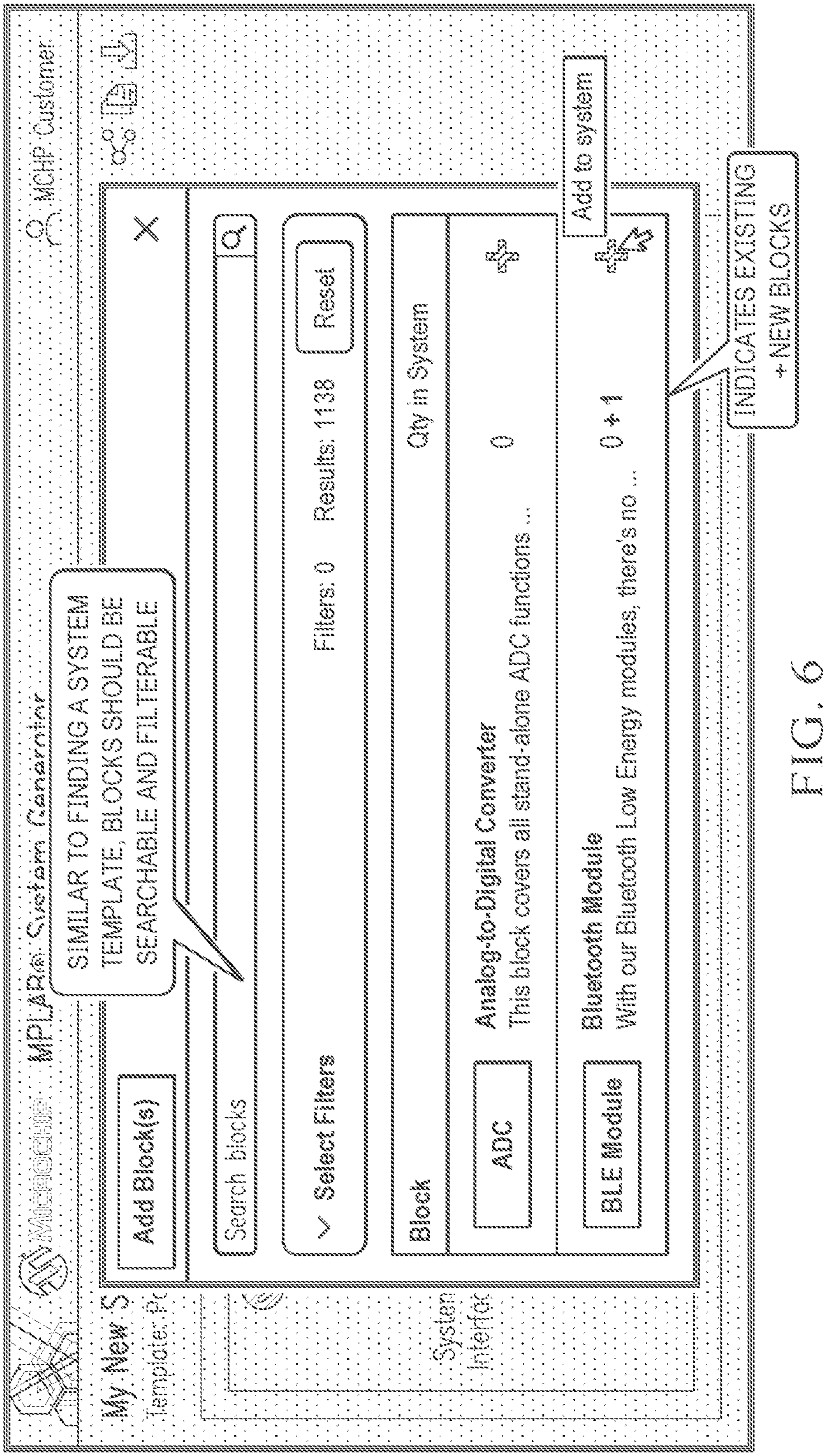
FIG. 6 illustrates an example screen for adding component blocks to those already in the system being generated.

FIG. 6 illustrates an example screen for adding blocks, representing additional components, to those already in the system being generated. A search feature allows the user to search for component blocks. Also, search filters may be implemented to narrow the field of component blocks. A list of component blocks may be provided as searched and filtered results. Component blocks may be added to the system being generated by selecting the green plus icon adjacent to the component description. After selecting all desired component blocks, the user may navigate back to the system generator tool screen.

Figure 7:
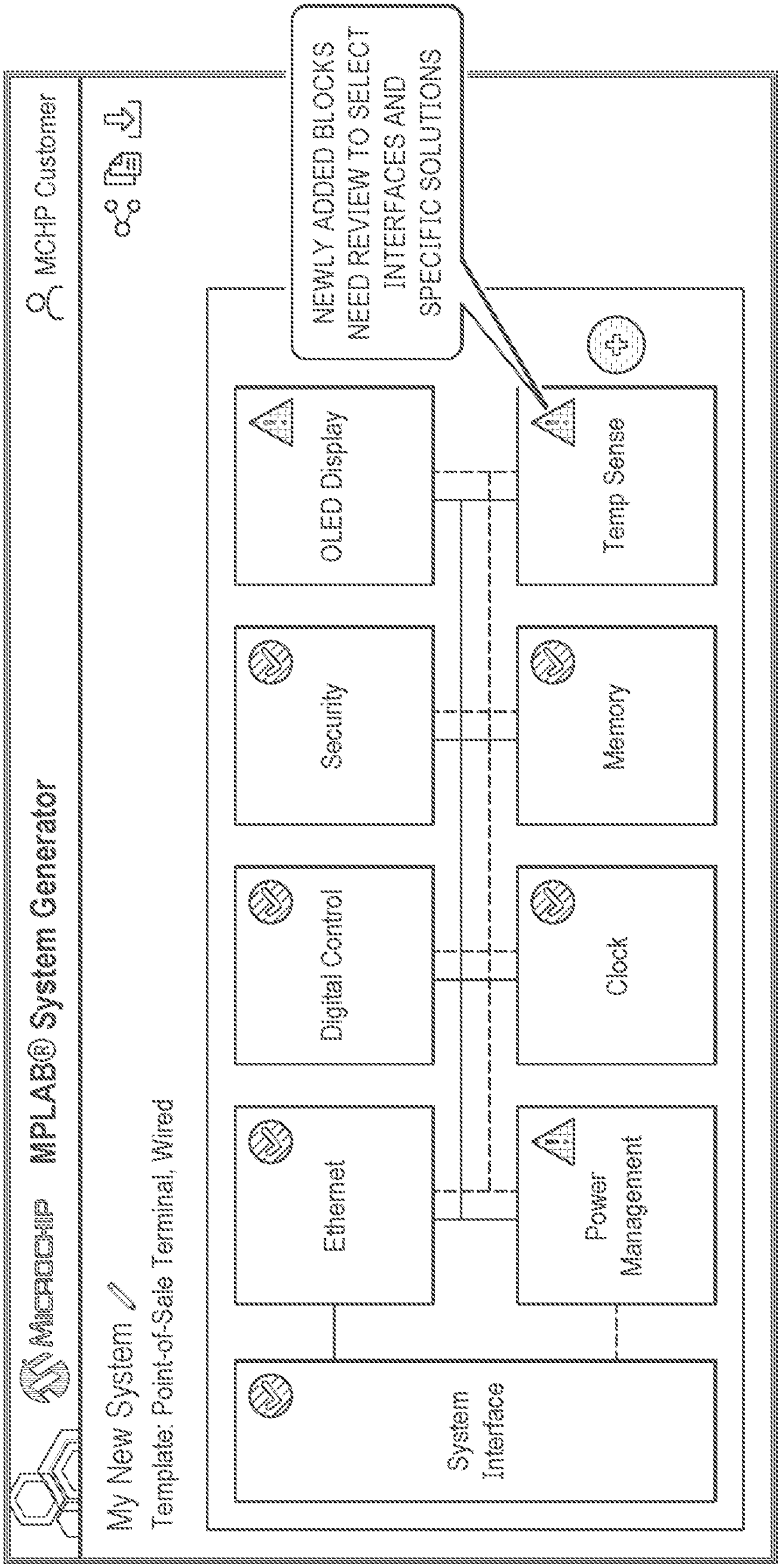
FIG. 7 illustrates an example of the system generated screen of FIG. 5, where two additional component blocks have been added to the system.

FIG. 7 illustrates an example of the system generated screen of FIG. 5, where two additional new component blocks have been added to the system: OLED Display and Temp Sense. Added component blocks OLED Display and Temp Sense need review to select interfaces and specific solutions. With the added component blocks integrated into the system being generated, the system generator tool again performs dependency checks between the component blocks. For example, blocks having a respective green circle with a check mark indicates the status of all dependencies between the components is GOOD. In this case, all component blocks are indicated as GOOD, except for the newly added component blocks (OLED Display and Temp Sense) and the Power Management block, which have a yellow triangle with an exclamation point indicating the status of the block is NEEDS ATTENTION. The user may select the OLED Display and the Temp Sense component blocks to navigate to block modification screens to identify more compatible components, i.e., components where the cross-block dependencies and cross-function dependencies may check out as GOOD. See FIG. 4. For example, the OLED Display shown in FIG. 7 may be replaced with an LCD as shown in FIG. 8.

Figure 8:
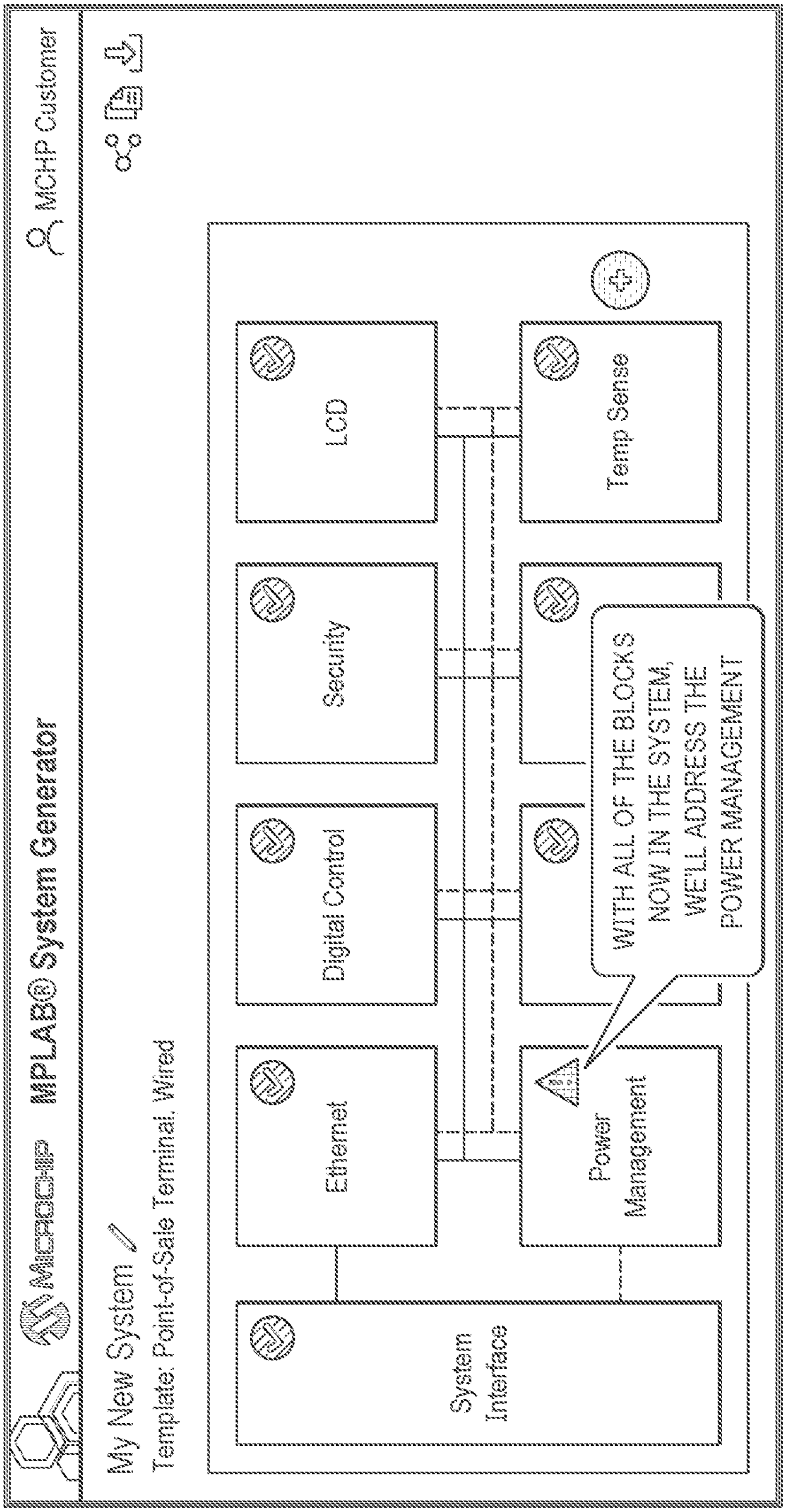
FIG. 8 illustrates an example of the system generated screen of FIG. 7, where the two new component blocks have been configured by the user and cross-dependency checks have been performed.

FIG. 8 illustrates an example of the system generated screen of FIG. 7, where the two component blocks have been replaced or reconfigured: LCD and Temp Sense. With the replaced or reconfigured component blocks integrated into the system being generated, the system generator tool again performs dependency checks between the component blocks. The blocks having a respective green circle with a check mark indicates the status of all dependencies between the components is GOOD. In this case, all component blocks are GOOD, except for the Power Management block, which has a yellow triangle with an exclamation point indicating the status of the block is NEEDS ATTENTION. Because the Power Management component provides power to all the other components, it may be more efficient to configure this component after the other components have been identified. The user may navigate to a screen for updating the Power Management block by selecting the Power Management block.

Figure 9:
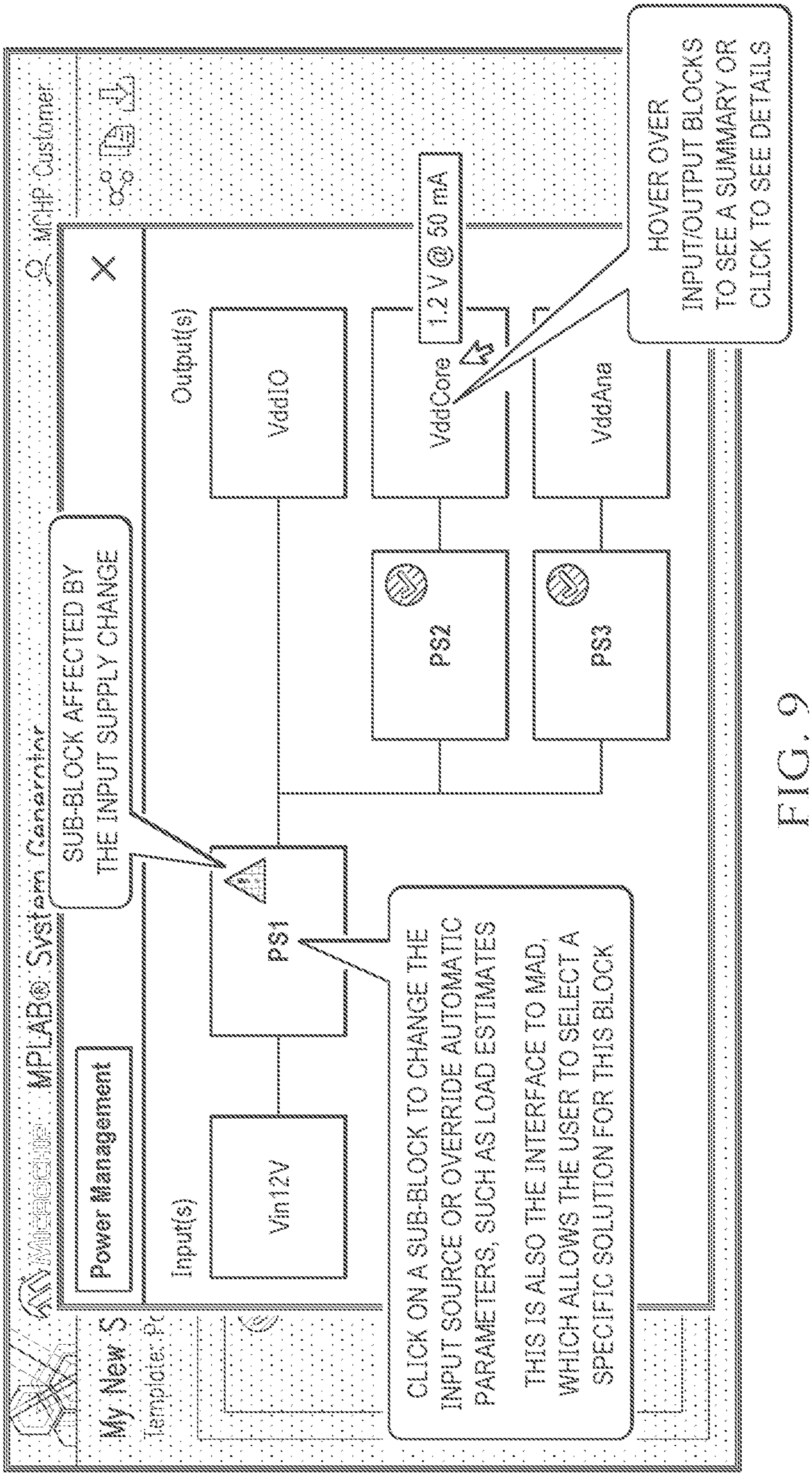
FIG. 9 illustrates an example screen for updating the Power Management component.

FIG. 9 illustrates an example screen for updating the Power Management component. In this case, the power input is Vin12V and the power outputs include: VddIO, VddCore, and VddAna. By hovering over the respective input and output blocks, the user may see summaries or select to see details. A summary of the VddCore block shows it is 1.2 V @ 50 mA. The sub-blocks PS2 and PS3, which provide power for VddCore and VddAna respectively, are indicated with a GOOD status by the green circle with a check mark. However, the sub-block for PS1 indicates the status of the block is NEEDS ATTENTION. The user may select the respective sub-blocks to change the input source or override automatic parameters, such as load estimates. This may also be the interface to the MPLAB Analog Designer (MAD), which allows the user to select a specific solution for this sub-block. After updating the sub-blocks of the Power Management component block, the user may navigate back to the system generator tool system-level screen. The user may also view the rail details by clicking on the lines between the sub-blocks or component blocks.

Figure 10:
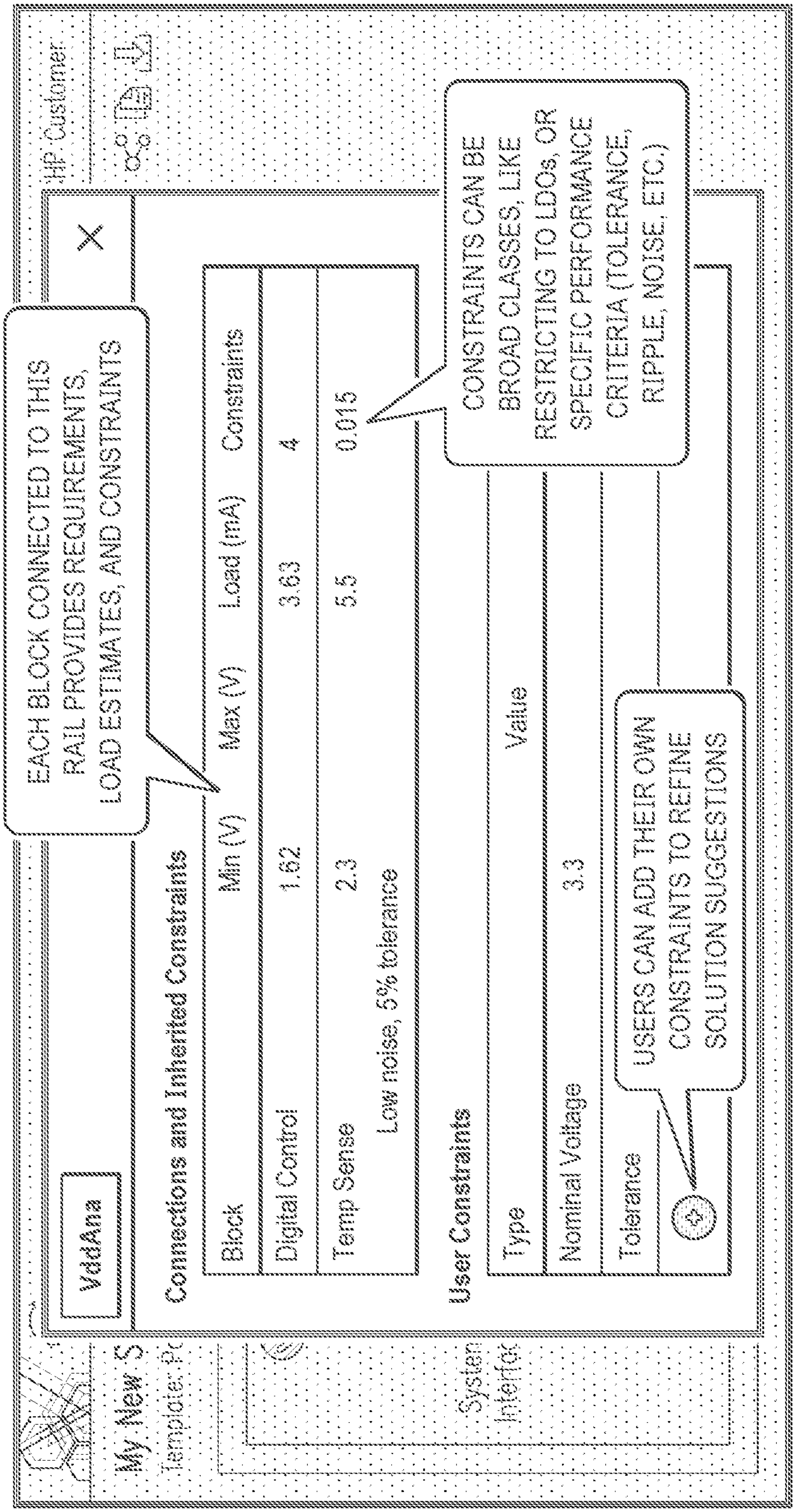
FIG. 10 illustrates an example screen for viewing rail details, including the connections and inherited constraints.

FIG. 10 illustrates an example screen for viewing rail details, including the connections to the rail and inherited constraints. In this case, the VddAna rail details are shown. Blocks connected to this rail provide respective requirements, such as load estimates and constraints. The constraints may be broad constraint classes such as restricting to low-dropout regulators, or specific performance criteria, such as tolerances and noise. The digital control of the VddAna sub-block has 1.62 Min (V), 3.63 Max (V), 4 mA Load, and no constraints. The temp sense of the VddAna sub-block has 2.3 Min (V), 5.5 Max (V), 0.015 mA Load, and low noise constraints. The user may close the rail detail window to navigate back to the system generator tool system-level screen.

Figure 11:
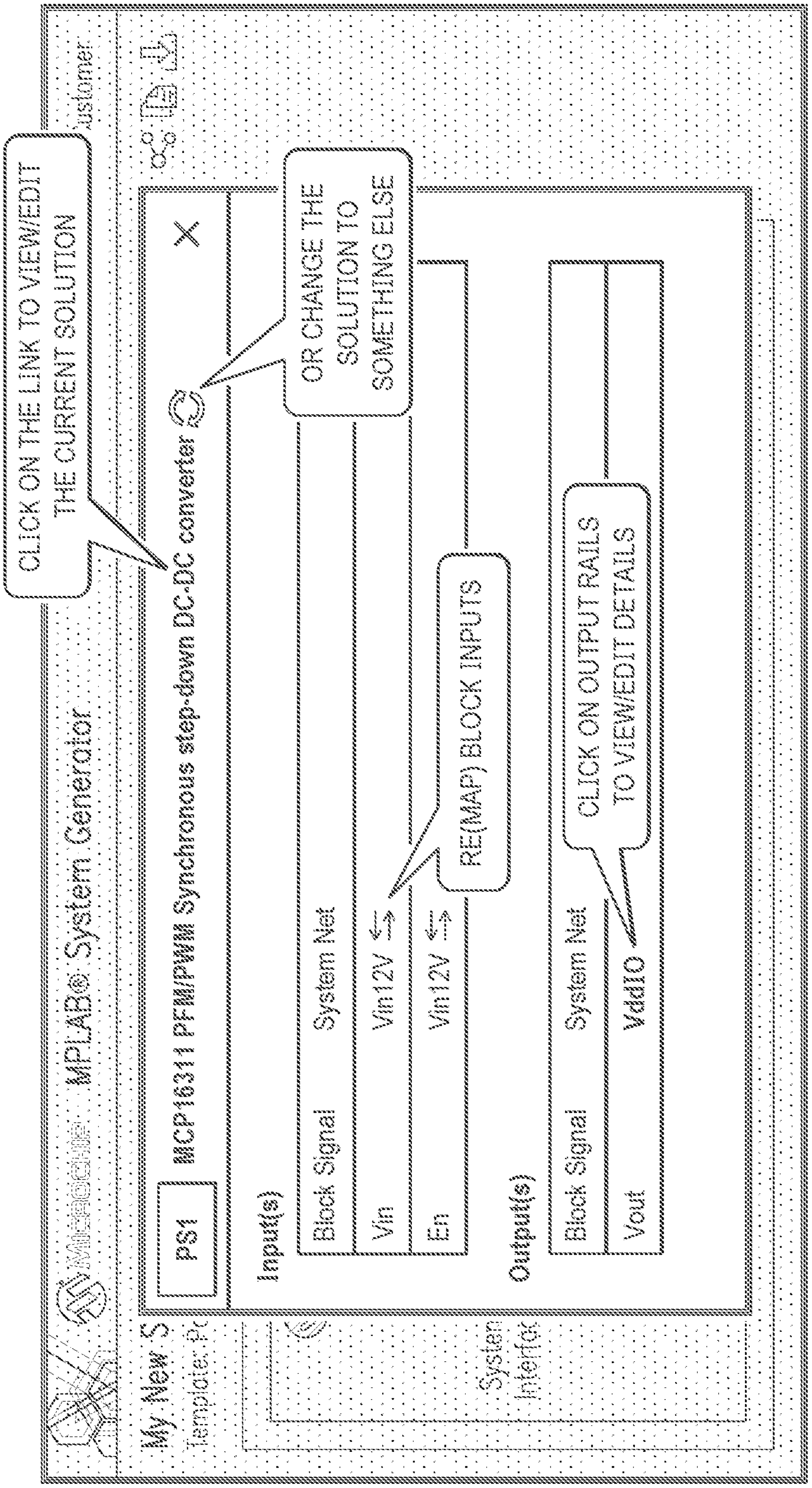
FIG. 11 illustrates an example screen for viewing inputs and outputs of the PS1 sub-block of the Power Management component block.

FIG. 11 illustrates an example screen for viewing inputs and outputs of the PS1 sub-block of the Power Management component block. See FIG. 9. In this case, the user may select the link for the component to view/edit the selection, or select a different component. The Inputs include Vin and En block signals which are both mapped to the system net Vin12V. The user may select these parameters to map them to other system-level signals. The Output is a Vout block signal where the system net is VddIO. The user may select the output rails to view/edit the detailed parameters, as illustrated in FIG. 10. The user may close the input/output detail window to navigate back to the system generator tool screen.

Figure 12:
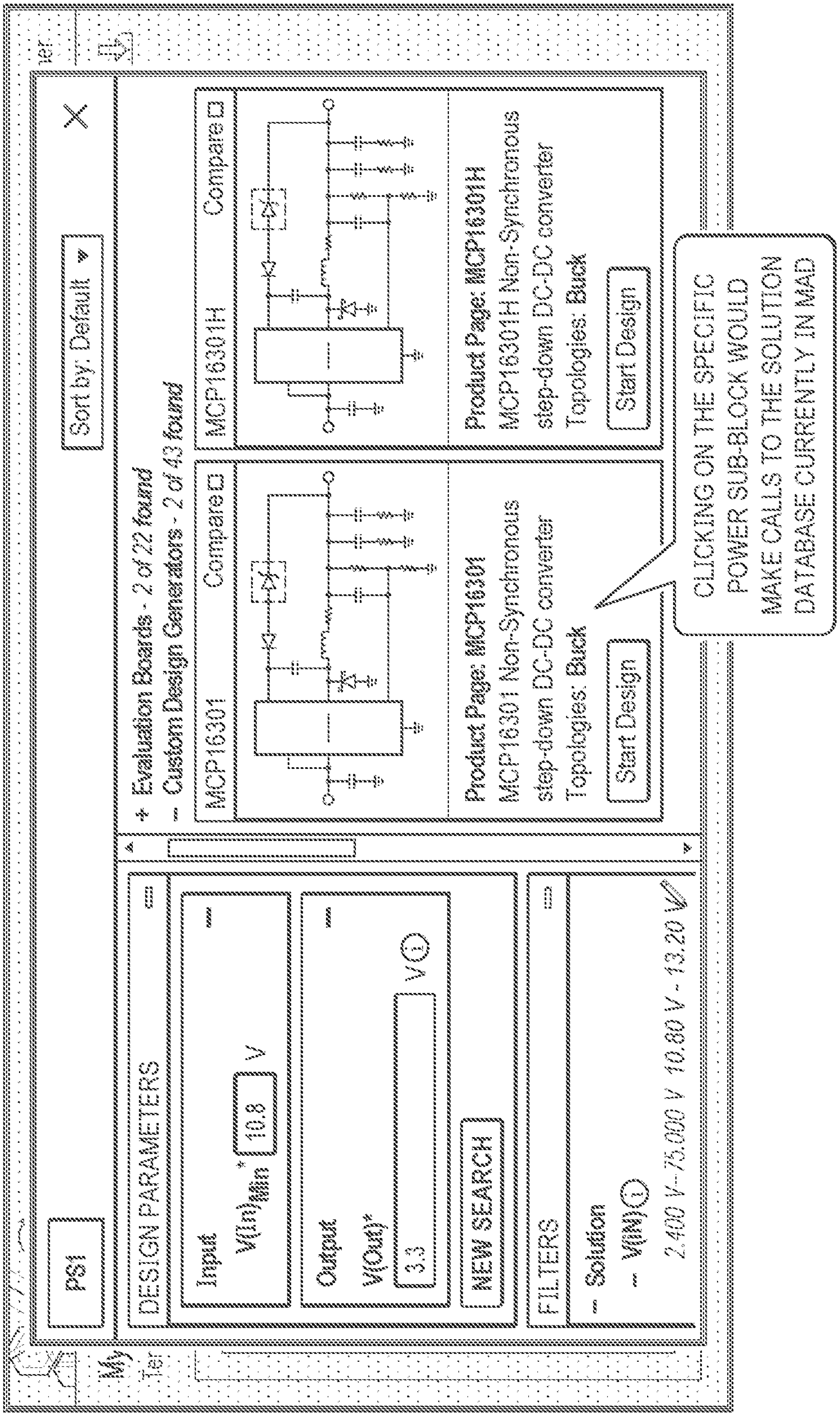
FIG. 12 illustrates an example window for updating the rail generation for component blocks or sub-blocks.

FIG. 12 illustrates an example window for updating the rail generation for component blocks or sub-blocks. This window updates sub-block PS1 of the Power Management component block shown in FIG. 9. The rail generation window allows the user to view or alter design parameters and filters, prepopulated by the PS1 sub-block constraints, for querying the MPLAB Analog Designer (MAD) to identify component blocks and sub-blocks that satisfy the needed design parameters. In particular, the MPLAB Analog Designer (MAD) may provide a list of recommendations (solution selection step) from which a user may select a specific solution to start a design generation phase, also utilizing MAD. When the user selects the specific power sub-blocks, the system generator tool may make calls to the solution database, for example implemented in MAD. The user may select appropriate components that meet the design parameters and navigate back to the system generation window. The system generator tool again performs dependency checks between the component blocks. Component blocks having a respective green circle with a check mark indicates the status of all dependencies between the components is GOOD.

Figure 13:
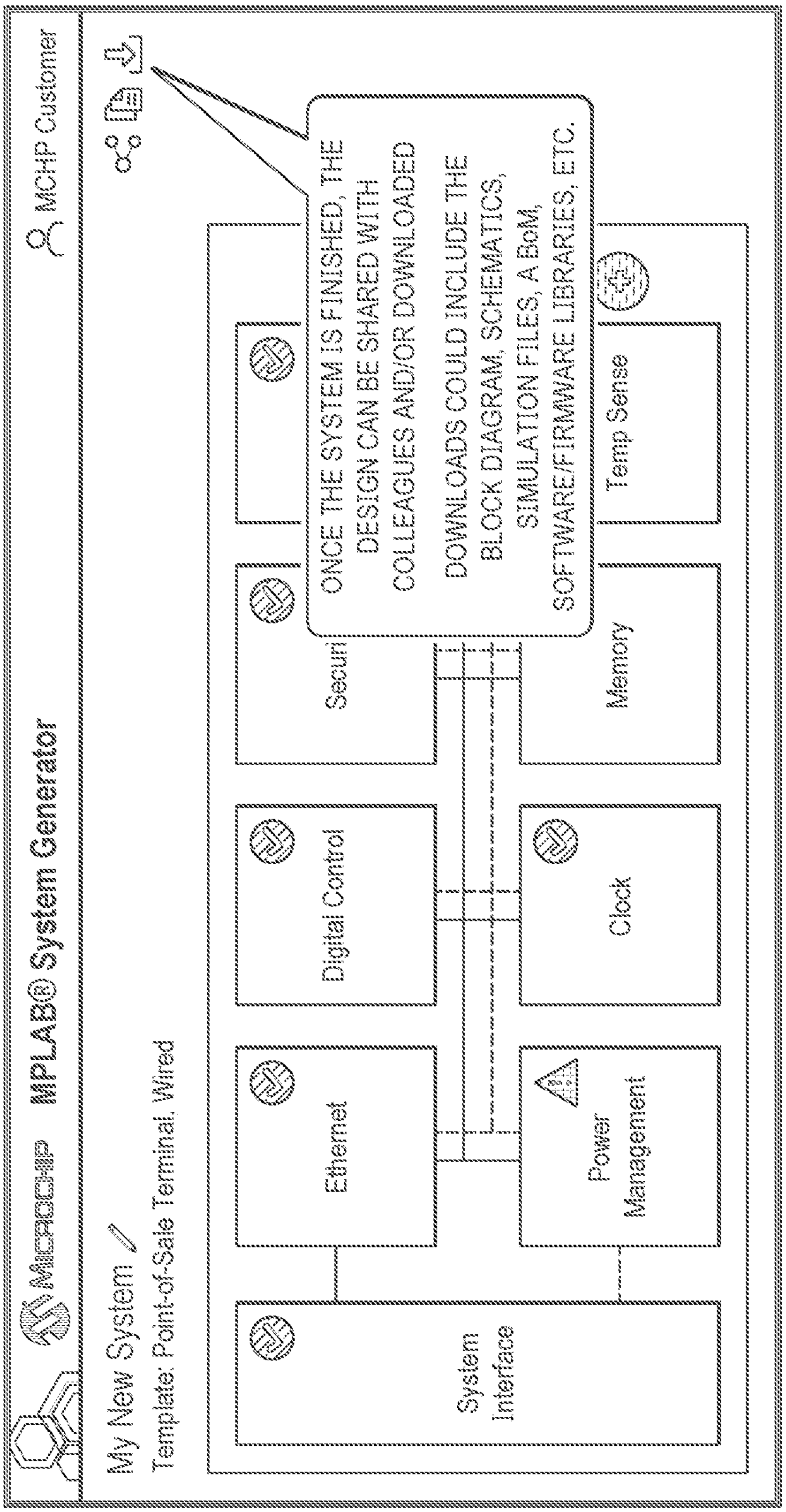
FIG. 13 illustrates an example of how users may share and export design files from the system generator tool window.

FIG. 13 illustrates an example of how users may share and export design files from the system generator tool. Once the system generator tool has generated the system design, the system design can be shared with colleagues and/or downloaded. Downloads may include a block diagram, schematics, simulation files, a bill of materials, or software/firmware libraries, a printed circuit board layout, and software, without limitation.

Figure 14:
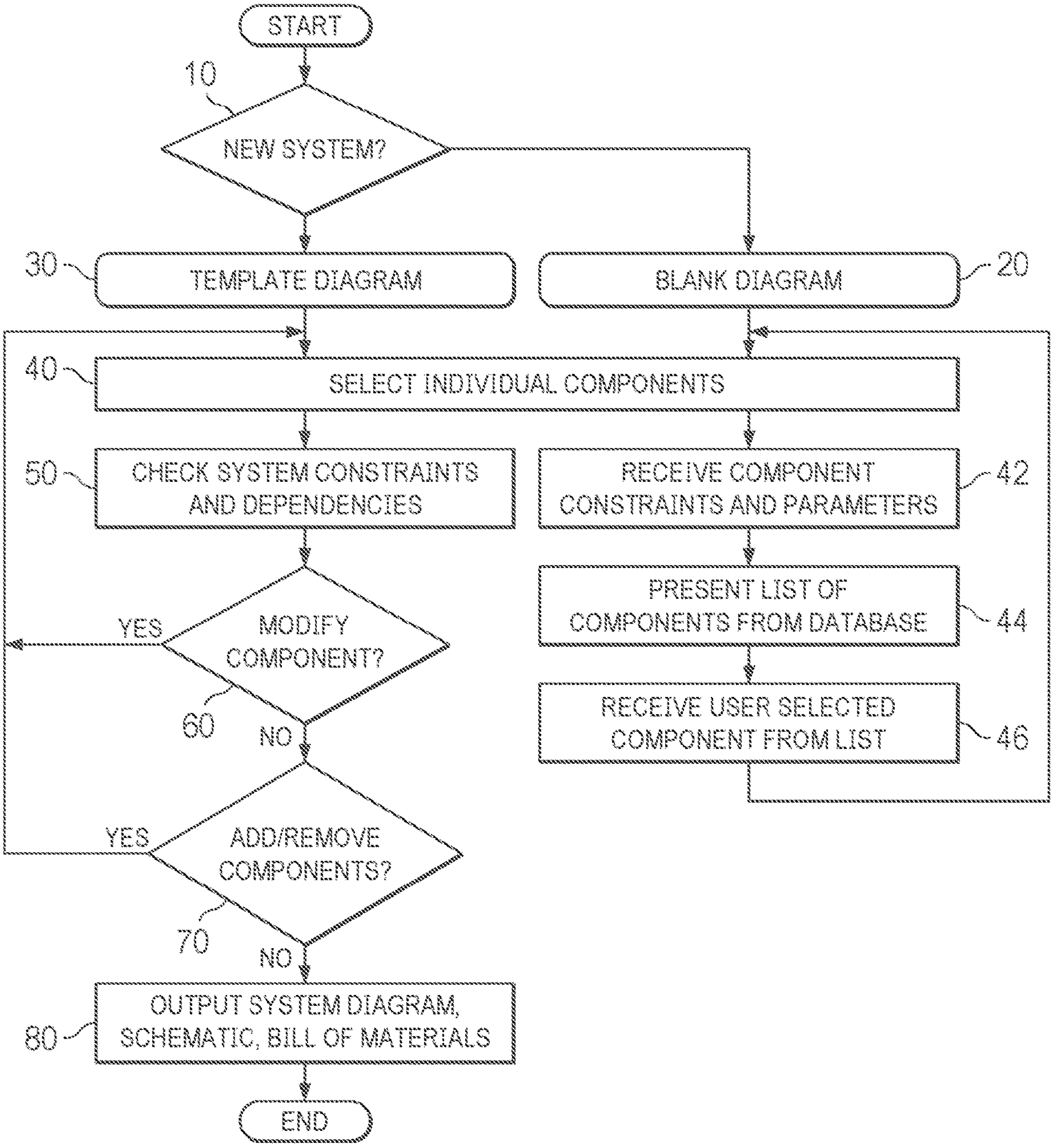
FIG. 14 illustrates an example flow chart of a process for generating an electronic system comprised of semiconductor and other components.

FIG. 14 illustrates an example flow chart of a process for generating a system comprised of semiconductors and other components. The algorithm starts and prompts the user to select 10 a new system. The new system may be selected from a template diagram or a blank diagram. If a blank diagram is selected, the user builds 20 the system by adding component blocks. The user is then prompted to select 40 individual components for each of the component blocks in the system. The system receives 42 component constraints and parameters to configure an individual component block. The system generator tool then presents 44 a list of component candidates from the database of components. The system receives user selections 46 of a component from the list or the system generator tool selects the component from the list. The subroutine 40, 42, 44, 46 for selecting individual components is repeated for each component block in the system diagram. After all the individual components in the system diagram have been selected, the system generator tool checks 50 for system constraints and dependencies and indicates to the user whether each block is GOOD or NEEDS ATTENTION. The user may then modify 60 a block by returning to the subroutine 40, 42, 44, 46 for selecting individual components. The user may also add or remove 70 component blocks from the system diagram by returning to the subroutine 40, 42, 44, 46 for selecting individual components. If no blocks are to be modified and no blocks are to be added or removed, the system generator tool allows the user to output 80 system diagrams, schematics, and bills of materials.

Figure 15:
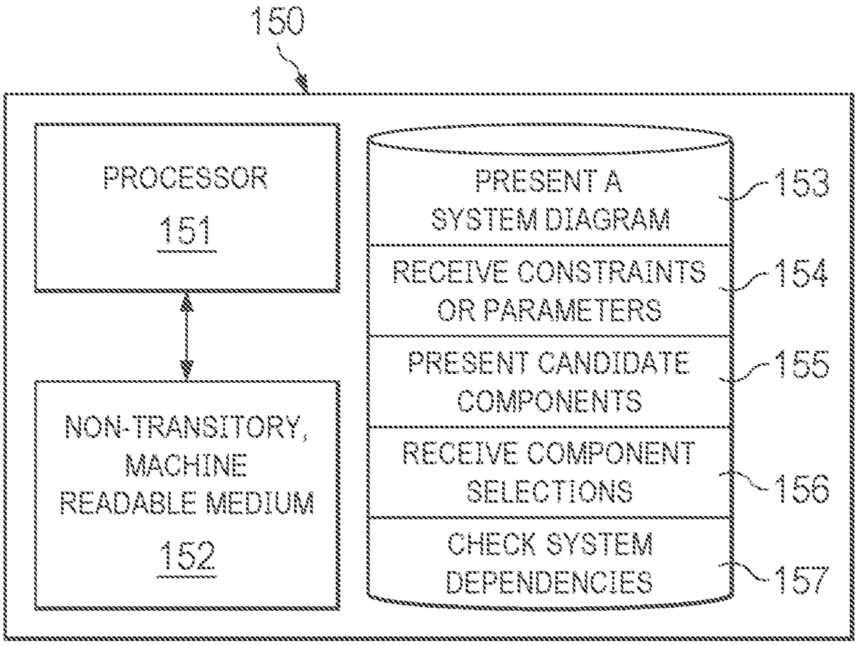
FIG. 15 illustrates an example schematic diagram of a system generator tool.

FIG. 15 illustrates an example schematic diagram of a system generator tool 150 having a processor 151 and a non-transitory machine readable medium 152. The system generator tool 150 also has a system diagram presentation circuit 153 presenting a system diagram of an electronic system having component blocks representing electrical components, a constraints or parameters input circuit 154 receiving constraints or parameters for each electrical component represented by the component blocks, a candidate component presentation circuit 155 presenting a list of candidate components corresponding to the constraints or parameters for each electrical component represented by the component blocks, a component selection circuit 156 receiving an instruction to select a component from the list candidate components for each electrical component represented by the component blocks, and a check system dependencies circuit 157 checking system dependencies all electrical components selected for inclusion in the system diagram. System generator tool 150, system diagram presentation circuit 153, constraints or parameters input circuit 154, candidate component presentation circuit 155, component selection circuit 156, and check system dependencies circuit 157 may be implemented by instructions for execution by processor 151, analog circuitry, digital circuitry, control logic, digital logic circuits programmed through hardware description language, application specific integrated circuits (ASIC), field programmable gate arrays (FPGA), programmable logic devices (PLD), or any suitable combination thereof, whether in a unitary device or spread over several devices. System generator tool 150, system diagram presentation circuit 153, constraints or parameters input circuit 154, candidate component presentation circuit 155, component selection circuit 156, and check system dependencies circuit 157 may be implemented by instructions for execution by processor 151 through, for example, a function, application programming interface (API) call, script, program, compiled code, interpreted code, binary, executable, executable file, firmware, object file, container, assembly code, or object. For example, system generator tool 150, system diagram presentation circuit 153, constraints or parameters input circuit 154, candidate component presentation circuit 155, component selection circuit 156, and check system dependencies circuit 157 may be implemented by instructions stored in the non-transitory medium 152 such as a memory that, when loaded and executed by the processor 151 such as CPU (or any other suitable processor), cause the functionality of system generator tool 150, system diagram presentation circuit 153, constraints or parameters input circuit 154, candidate component presentation circuit 155, component selection circuit 156, and check system dependencies circuit 157 described herein.

In particular examples, the system tool may call other tools via APIs, wherein the system may be a network of processors that perform the tasks.

Although examples have been described above, other variations and examples may be made from this disclosure without departing from the spirit and scope of these disclosed examples.

The invention claimed is:

1. An apparatus comprising:

a processor a non-transitory, machine-readable medium including instructions wherein the instructions, when loaded and executed by the processor, cause the processor to build system-level designs made up of components and microchips that have cross-block or cross-function dependencies by:

presenting a system diagram of an electronic system having component blocks representing components and sub-blocks of component blocks representing microchips;

receiving constraints or parameters for each electrical component represented by the component blocks and for each microchip represented by the sub-blocks of component blocks;

presenting a list of candidate components corresponding to the constraints or parameters for each electrical component represented by the component blocks and a list of candidate microchips corresponding to the constraints or parameters for each microchip represented by the sub-blocks of component blocks;

receiving an instruction to select a component from the list of candidate components for each electrical component represented by the component blocks and to select a microchip from the list of candidate microchips represented by the sub-blocks of component blocks; and checking system cross-block or cross-function dependencies for all components and microchips selected for inclusion in the system diagram.

2. The apparatus of claim 1, wherein the presenting of a system diagram of an electronic system comprises presenting a template diagram.

3. The apparatus of claim 1, wherein receiving constraints or parameters comprises receiving constraints or parameters selected from power, bandwidth, and noise.

4. The apparatus of claim 1, wherein the instructions, when loaded and executed by the processor, cause the processor to build the system-level designs by receiving an instruction to modify a component block by selecting a new component.

5. The apparatus of claim 1, further comprising instructions, when loaded and executed by a processor, cause the processor to build system-level designs by adding or removing a component block to or from the system diagram.

6. The apparatus of claim 1, further comprising instructions, when loaded and executed by a processor, configure the processor to build system-level designs by adding or removing a sub-block of a component block to or from the system diagram.

7. The apparatus of claim 1, further comprising instructions, when loaded and executed by a processor, configure the processor to build system-level designs by outputting a description of the components and microchips of the system diagram.

8. The apparatus of claim 7, wherein the description of the components and microchips of the system diagram is selected from a diagram, a schematic, a bill of materials, a printed circuit board layout, and software.

9. A method comprising:

building system-level designs made up of components and microchips that satisfy design parameters and have cross-block or cross-function dependencies by:

presenting a system diagram having component blocks and sub-blocks of component blocks;

receiving constraint or parameters for components represented by the component blocks and for microchips represented by the sub-blocks of component blocks;

presenting a list of candidate components corresponding to the constraints or parameters for components represented by the component blocks and a list of candidate microchips corresponding to the constraints or parameters for microchips represented by the sub-blocks of component blocks;

receiving an instruction to select a component from the list of candidate components and to select a microchip from the list of candidate microchips; and checking system cross-block or cross-function dependencies of all components and microchips in the system diagram.

10. The method of claim 9, wherein the presenting a system diagram comprises presenting a template diagram.

11. The method of claim 9, wherein receiving constraint or parameters comprises receiving a constraint or parameter selected from power, bandwidth, and noise.

12. The method of claim 9, further comprising receiving an instruction to modify a component block by selecting a new component.

13. The method of claim 9, further comprising adding or removing a component block to or from the system diagram.

14. The method of claim 9, further comprising adding or removing a sub-block of a component block to or from the system diagram.

15. The method of claim 9, further comprising outputting a description of the components and microchips of the system diagram.

16. The method of claim 15, wherein the description of the components and microchips of the system diagram is selected from a diagram, a schematic, a bill of materials, a printed circuit board layout, and software.

17. A system comprising:

a presentation circuit that presents a system diagram of an electronic system having component blocks representing electrical components and sub-blocks of component blocks representing microchips;

a constraint or parameter input circuit that receives constraint or parameter inputs for each electrical component represented by the component blocks and for each microchip represented by the sub-blocks of component blocks;

a component circuit that presents a list of candidate components corresponding to the constraints or parameters for each component represented by the component blocks and presents a list of candidate microchips corresponding to the constraints or parameters for each microchip represented by the sub-blocks of component blocks;

a component selection circuit that receives an instruction to select a component from the list of candidate components for each electrical component represented by the component blocks and to select a microchip from the list of candidate microchips represented by the sub-blocks of component blocks; and a system dependency circuit that checks system dependencies to confirm compatibility of all components and microchips selected for inclusion in the system diagram.

18. The system of claim 17, wherein the constraint or parameters circuit receives constraint or parameter inputs selected from power, bandwidth, and noise.

19. The system of claim 17, wherein the presentation circuit outputs a description of the components and microchips of the system diagram selected from a diagram, a schematic, a bill of materials, a printed circuit board layout, and software.

20. The system of claim 17, wherein the system dependencies checked by the system dependency circuit are selected from power, communication, digital control, security, clock, and memory.

* * * * *